(12) United States Patent
Lee et al.

(10) Patent No.: US 6,475,916 B1
(45) Date of Patent: Nov. 5, 2002

(54) METHOD OF PATTERNING GATE ELECTRODE WITH ULTRA-THIN GATE DIELECTRIC

(75) Inventors: James Yong Meng Lee, Singapore (SG); Yun Qiang Zhang, Singapore (SG); Chock Hing Gan, Singapore (SG); Ravi Sundaresan, Plano, TX (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/483,936

(22) Filed: Jan. 18, 2000

(51) Int. Cl.$^7$ ............................................. H01L 21/302
(52) U.S. Cl. ...................... 438/706; 438/710; 438/712; 438/720
(58) Field of Search ................... 438/706, 710, 438/720, 712, 585, 586, 587, 283, 287, 299

(56) References Cited

U.S. PATENT DOCUMENTS

| | | | |
|---|---|---|---|
| 5,399,508 A | | 3/1995 | Nowak ........................ 437/27 |
| 5,429,070 A | * | 7/1995 | Campbell et al. ........ 118/723 R |
| 5,447,874 A | | 9/1995 | Grivna et al. ................. 437/40 |
| 5,472,894 A | | 12/1995 | Hsu et al. ..................... 437/44 |
| 5,744,387 A | * | 4/1998 | Tseng ......................... 438/253 |
| 5,766,998 A | | 6/1998 | Tseng ......................... 438/291 |
| 5,786,255 A | | 7/1998 | Yeh et al. .................... 438/299 |
| 5,786,256 A | | 7/1998 | Gardner et al. ............. 438/305 |
| 5,817,560 A | | 10/1998 | Gardner et al. ............. 438/301 |
| 5,915,181 A | | 6/1999 | Tseng ......................... 438/289 |
| 5,937,297 A | | 8/1999 | Peidous ...................... 438/270 |
| 6,074,921 A | * | 6/2000 | Lin ............................. 438/299 |
| 6,130,121 A | * | 10/2000 | Sze ............................. 438/167 |
| 6,143,635 A | * | 11/2000 | Boyd et al. ................. 438/585 |

* cited by examiner

*Primary Examiner*—Felisa Hiteshew
*Assistant Examiner*—Lan Vinh
(74) *Attorney, Agent, or Firm*—George O. Saile; Rosemary L. S. Pike

(57) ABSTRACT

A new method is provided for the creation of ultra-thin gate oxide layers. Under the first embodiment, sacrificial oxide and nitride are deposited, openings are created in the layer of nitride where the ultra-thin layer of gate oxide is to be created. A layer of poly is deposited over the layer of nitride. The layer of polysilicon is polished, leaving the poly deposited inside the openings. The nitride is removed leaving the gate structure in place overlying the grown gate oxide. Under the second embodiment, sacrificial oxide and nitride are deposited followed by the deposition of TEOS oxide. The layers of TEOS, oxide and nitride are patterned creating openings that expose the surface areas of the layer of sacrificial oxide where the ultra-thin layers of gate oxide are to be grown. A thin conformal layer of nitride is deposited over the structure, this thin layer of conformal nitride is etched to form thin spacers on the sidewalls of the openings in the layers of TEOS oxide and nitride. Pre-gate clean is performed that removes the TEOS oxide and the sacrificial oxide on the bottom of the openings, gate oxidation is performed creating the ultra-thin layers of gate oxide. Poly is deposited, polished back followed by removal of the nitride leaving the poly gate structure in place and overlying the ultra-thin layer of gate oxide.

24 Claims, 7 Drawing Sheets

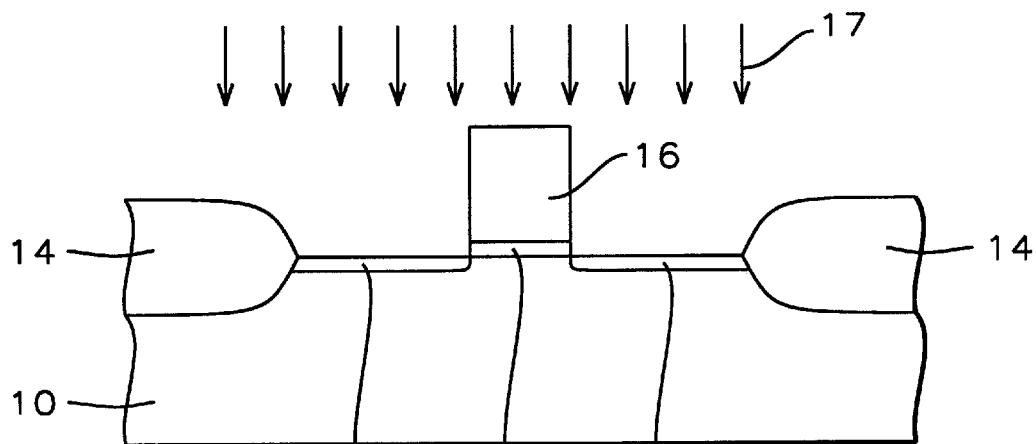
FIG. 1a — Prior Art
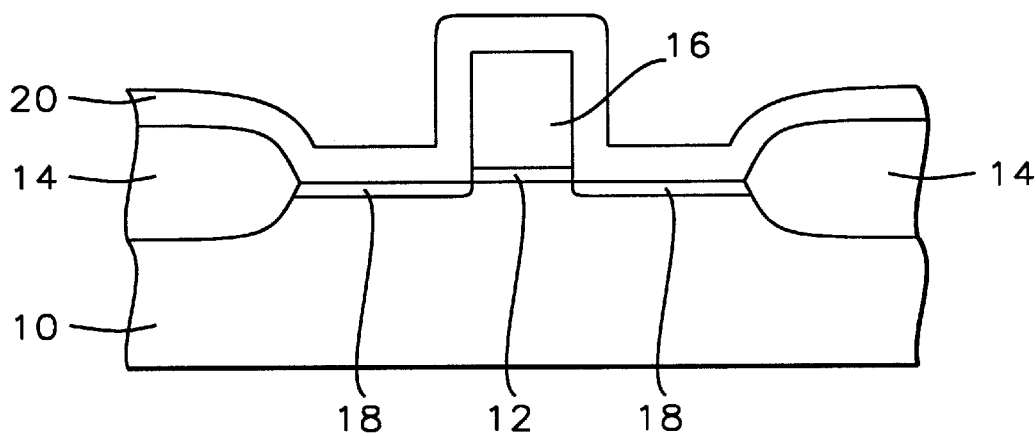
FIG. 1b — Prior Art
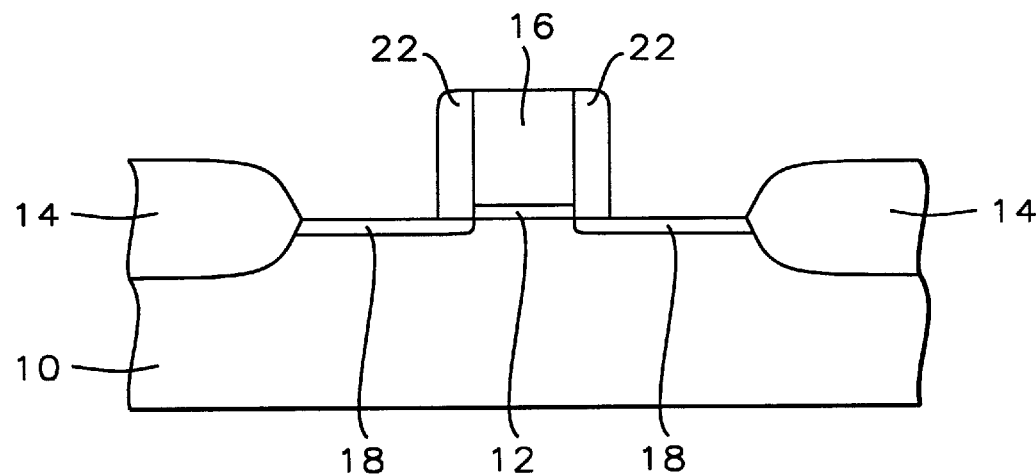
FIG. 1c — Prior Art

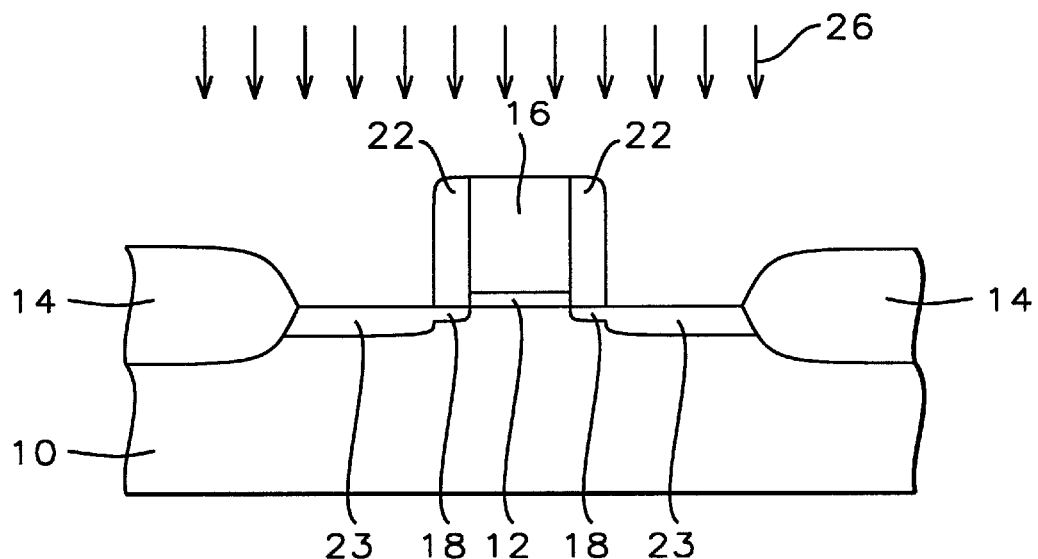
FIG. 1d – Prior Art
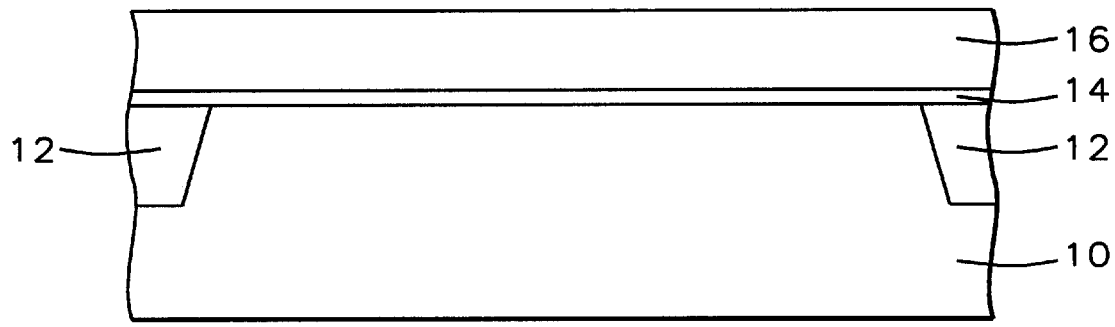
FIG. 2
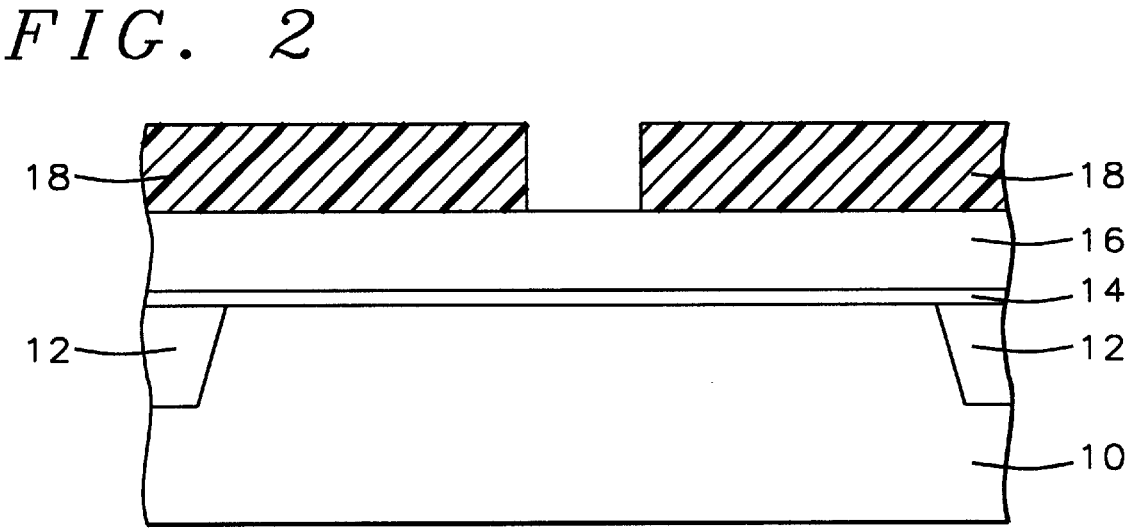
FIG. 3

METHOD OF PATTERNING GATE ELECTRODE WITH ULTRA-THIN GATE DIELECTRIC

BACKGROUND OF THE INVENTION (1) Field of the Invention

The invention relates to the fabrication of integrated circuit devices, and more particularly, to a method of creating poly gate electrodes with ultra-thin gate oxide dielectrics.

(2) Description of the Prior Art

Recent advances in semiconductor fabrication have resulted in significant decreases in device feature size and increase in device density thereby increasing device performance to a considerable degree. One of the frequently used devices in Ultra Large Scale Integration (ULSI) technology is the Field Effect Transistor (FET) that consists of a polysilicon gate electrode with self aligned source and drain regions. The popularity of FET devices is in no small measure due to their high packaging, low power consumption and high yields.

Conventional gate electrodes are fabricated by first growing a thin layer of gate oxide on the surface of a single crystalline semiconductor substrate. To reduce short channel effects that are caused by ultra-short device feature size, Lightly Doped Drain (LDD) regions are implanted into the surface of the substrate in addition to the implantation of source and drain regions. The channel length of a FET device is the distance under the gate electrode between the source and the drain contacts. For the creation of a typical gate electrode, a layer of polysilicon is deposited over a layer of gate oxide and etched using photolithography followed by anisotropic poly etch. The anisotropic poly etch typically stops on the gate oxide, for applications where the layer of gate oxide is very thin this etch stop can easily become a problem resulting in the etch for the poly gate proceeding into the underlying substrate. The invention addresses this problem.

The current method of fabricating MOSFET devices is briefly highlighted using FIGS. 1a through 1d.

FIG. 1a shows how the process of fabrication starts with a single crystal semiconductor substrate 10 that has been provided with a level of conductivity by doping the substrate with for instance a p-type impurity such as boron or indium forming a p-type well in the surface of the substrate. The active surface of the substrate in which the gate electrode is to be created is electrically isolated by the creation of the Field Oxide (FOX) or STI regions 14. A thin layer 12 of gate oxide is next grown over the active region in the surface of the substrate 10, a layer 16 of polysilicon is deposited and patterned to form the gate electrode. To offset the previously mentioned short channel effect, the LDD regions 18 are implanted (17) using a (in view of the p-type well) n-type impurity such as arsenic or phosphorous.

FIG. 1b shows the next step in the creation of the gate electrode, that is the creation of gate spacers that electrically isolate the gate electrode. For this purpose, a layer 20 of gate spacer material, such as silicon dioxide, is deposited as shown in FIG. 1b, that is over the surface of the gate electrode and its surrounding substrate including the surface of the FOX regions. The implanted ions of the LDD can at this time be further driven into the surface of the substrate by heating the substrate to a temperature of between 700 and 900 degrees C., a process that at the same time restores any damage to the surface of the substrate that the LDD ion implant may have caused. The gate spacer material that has been deposited must next be etched back from all regions others than the sidewalls of the gate electrode, this is achieved by applying an anisotropic dry etchback that removes most of the gate spacer material and only leaves gate spacer material in place where it was most densely deposited, that is on the sidewalls of the gate electrode. The gate spacers 22, FIG. 1c, have now been formed. The remaining step of forming the source 23 and 24 regions of the gate electrode is performed by the implant 26, FIG. 1d. This implant uses the same type impurity as has been used for the LDD implant but provides the implanted ions with higher dopant concentration and implant energy thereby creating deeper regions of impurity with higher concentration of these impurities.

It is clear that the process of creating MOSFET devices is relatively complicated and that the concurrent reduction in device feature size can readily lead to interaction of ion concentrations in closely spaced regions. For instance, the relatively low-energy LDD implant ions can readily interact with the sidewalls of the gate electrode during the implant causing non-uniform implant of the ions in the LDD regions. These uneven implants can create dense spots of ion concentrations in the LDD regions leading to leakage currents. It is also important that the LDD implant is correctly aligned with the gate electrode so as to avoid gaps between the LDD regions in the surface of the substrate and the gate electrode. This gap can lead to variations in the device threshold performance characteristics and can cause reliability concerns. It is further important that the surface of the substrate is not affected by the etch that is applied to create the gate electrode. Damage to the surface of the substrate causes increased leakage current over the surface of the substrate in addition to a non-uniform doping profile of the LDD and source/drain regions thereby increasing the standby current of the MOSFET. These effects and the elimination of these effects have received considerable attention in the field of semiconductor research and development. The present invention addresses the elimination of surface damage that can be caused to the surface of the substrate for sub-micron devices where a very thin layer of gate oxide is used as the stop layer for the gate electrode etch.

U.S. Pat. No. 5,786,256 (Gardner et al.) shows a gate opening in a SAC, SiN, and TEOS layer; form SiN spacer in gate opening; form thin gate oxide between spacers; form poly gate (inverse gate) between spacers using CMP. Note that Gardner specifies that the dielectric stack can have alternate compositions. See col. 5, lines 49 to 59. The are however major differences between Gardner et al. and the present invention, as follows:

the Gardner method is not optimized for gate oxide formation, especially for thin gate oxides that are less than 40 Angstrom the process of gate spacer etch stops on the silicon substrate and therefore damages the substrate prior to the formation of the layer of gate oxide the present invention addresses problems of gate oxide uniformity and reliability, these problems have not been addressed in the Gardner method of U.S. Pat. No. 5,786,256 the present invention uses a triple stack that surrounds the gate electrode. The top most layer of the stack is a layer of oxide that is used as etch stop for the gate spacer etch while the gate spacer of the invention is formed on top of the gate oxide and not on the surface of the substrate (as for Gardner), thus not damaging the substrate during spacer etch the invention provides a method for growing gate oxide less than 20 angstrom thick, and the invention uses nitride for spacer material.

U.S. Pat. No. 5,786,255 (Yeh et al.) shows an inverse gate process. Yeh appears to be similar with the instant invention and shows an inverse poly gate process with a thin gate oxide. One of the differences between Yeh et al. and the instant invention is that Yeh teaches the use of a silicon nitride layer for the definition of the poly gate that is the same as the silicon nitride that is used for the definition of the field isolation regions. The poly of the gate that is created in accordance with Yeh can therefore not be used as an interconnect while the poly of the gate of the invention extends beyond the field isolation regions and can therefore be used as an interconnect.

U.S. Pat. No. 5,817,560 (Gardner et al.), U.S. Pat. No. 5,472,894 (Hsu et al.), U.S. Pat. No. 5,766,998 (Tseng et al.) and U.S. Pat. No. 5,937,297 (Peidous) show other inverse gate processes (some with spacers).

U.S. Pat. No. 5,915,181 (Tseng) and U.S. Pat. No. 5,447,874 (Grivna et al.) teach inverse gates using a CMP.

U.S. Pat. No. 5,399,508 (Nowak) shows an etch back gate without CMP.

SUMMARY OF THE INVENTION

A principle objective of the invention is to provide a method of etching polysilicon gate electrodes in the environment of sub-micron device feature size.

Another objective of the invention is to avoid causing damage to the surface of the underlying substrate when etching polysilicon gate electrodes in the environment of sub-micron device feature size.

Yet another objective of the invention is to reduce plasma damage that can be experienced by plasma etching the poly gate structure.

A still further objective of the invention is to provide a method that uses CMP to create the poly gate electrode structure.

In accordance with the objectives of the invention a new method is provided for the creation of ultra-thin gate oxide layers. Under the first embodiment of the invention, a layer of sacrificial oxide and a layer of nitride are deposited, openings are created in the layer of nitride where the ultra-thin layer of gate oxide is to be created exposing the sacrificial oxide in these regions. Pre-clean is performed to the exposed surfaces of the gate oxide followed by gate oxide growth to the desired thickness. A layer of poly is deposited over the layer of nitride, also filling the openings that have been created in the nitride. The layer of polysilicon is polished, leaving the poly deposited inside the openings. The nitride is removed leaving the gate structure in place and overlying the grown gate oxide. Under the second embodiment of the invention, a layer of sacrificial oxide and a layer of nitride are deposited followed by the deposition of a layer of TEOS oxide. The layers of TEOS oxide and nitride are patterned creating openings that expose the surface areas of the layer of sacrificial oxide where the ultra-thin layers of gate oxide are to be grown. A thin conformal layer of nitride is deposited over the structure including the openings that have been created in the layers of TEOS oxide and nitride, this thin layer of conformal nitride is etched to form thin spacers on the sidewalls of the openings in the layers of TEOS oxide and nitride. Pre-gate clean is performed that removes the TEOS oxide and the sacrificial oxide on the bottom of the openings, gate oxidation is performed creating the ultra-thin layers of gate oxide. Poly is deposited, polished back followed by removal of the nitride leaving the poly gate structure in place and overlying the ultra-thin layer of gate oxide.

BRIEF DESCRIPTION OF THE DRAWINGS

FIGS. 1a through 1d show cross sections of Prior Art creation of a gate electrode, as follows:

FIG. 1a shows a cross section of a semiconductor surface on which Field Oxide regions have been defined, the gate electrode has been partially completed and LDD implants have been performed.

FIG. 1b shows a cross section after deposition of a layer of gate spacer material.

FIG. 1c shows a cross section after the formation of the gate spacers on the sidewalls of the structure of the gate electrode.

FIG. 1d shows a cross section alter the source and drain regions have been implanted self-aligned with the gate electrode.

FIGS. 2 through 8 address the first embodiment of the invention, as follows:

FIG. 2 shows a cross section of a semiconductor surface in which Shallow Trench Isolation regions have been formed, a thin layer of gate oxide has been grown and a layer of nitride has been deposited over the layer of gate oxide.

FIG. 3 shows a cross section after a layer of photoresist has been deposited over the layer of nitride and has been reverse patterned for the gate electrode.

FIG. 4 shows a cross section after the layer of nitride has been etched in accordance with the reverse pattern of the layer of photoresist.

FIG. 5 shows a cross section after the layer of patterned photoresist has been removed from the surface of the layer of nitride.

FIG. 6 shows a cross section after a thick layer of polysilicon has been deposited over the layer of nitride thereby including the opening that has been created in the layer of nitride.

FIG. 7 shows a cross section after the thick layer of polysilicon has been polished down to the surface of the layer of nitride.

FIG. 8 shows a cross section after the layer of nitride has been removed from the surface of the layer of gate oxide leaving the poly gate structure in place.

FIG. 9 shows a cross section of a semiconductor surface in which Shallow Trench Isolation regions have been formed, a thin layer of sacrificial oxide has been grown, a layer of nitride has been deposited over the layer of gate oxide, a layer of TEOS oxide has been deposited over the layer of nitride.

FIG. 10 shows a cross section after a layer of photoresist has been deposited over the layer of TEOS oxide and has been patterned for the gate electrode.

FIG. 11 shows a cross section after the layer of TEOS oxide and the layer of nitride have been etched in accordance with the pattern of the layer of photoresist.

FIG. 12 shows a cross section after the layer of patterned photoresist has been removed from the surface of the layer of TEOS oxide and a thin layer of nitride has been deposited over the layer of TEOS oxide thereby including the opening that has been created in the layer of nitride.

FIG. 13 shows a cross section after the thin layer of nitride has been etched thereby creating the sidewall spacers for the gate electrode.

FIG. 14 shows a cross section after the layer of sacrificial oxide has been transformed into a layer of gate oxide and the thin layer of TEOS oxide has been removed.

FIG. 15 shows a cross section after a thick layer of poly has been deposited over the surface of the layer of nitride thereby including the opening that has been created in the layer of nitride.

FIG. 16 shows a cross section after the thick layer of poly has been polished down to the surface of the layer of nitride.

FIG. 17 shows a cross section after the layer of nitride has been removed leaving the gate oxide unaffected by any plasma etch.

DESCRIPTION OF THE PREFERRED EMBODIMENTS

Figure 4:
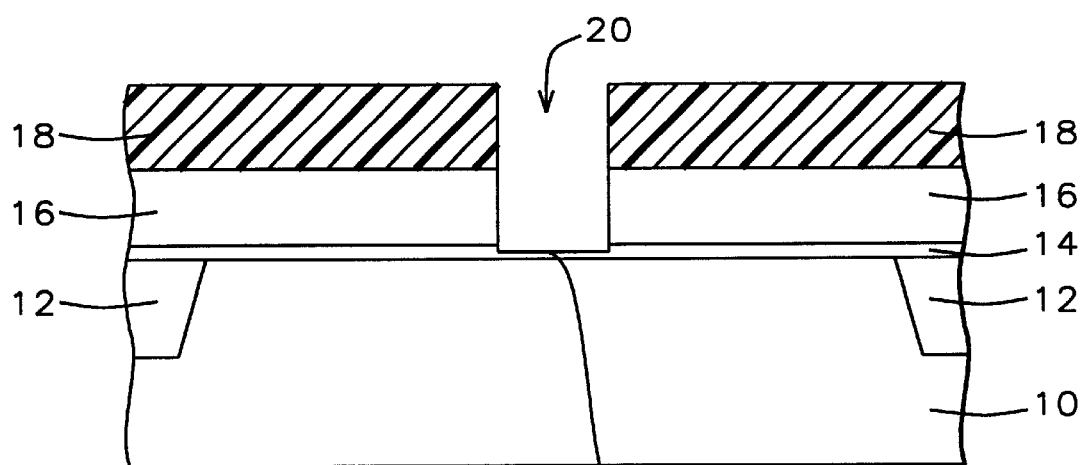

FIGS. 2 through 8 address the first embodiment of the invention.

Referring now specifically to FIG. 2, there is shown a cross section of a semiconductor surface 10 in which Shallow Trench Isolation regions 12 have been formed, a thin layer 14 of gate oxide has been grown and a layer 16 of nitride has been deposited over the layer 14 of gate oxide.

Substrate 10 is typically of single crystalline silicon with <100> crystal orientation. STI's regions 12 can be made using a number of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.5 and 0.8 micrometer (um.) deep. STI are formed around the active device to a depth between 4000 and 20000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

The layer 14 of sacrificial oxide is grown on the bare silicon after the silicon surface has been cleaned. The layer consists of an about 150 Angstrom thick layer of $SiO_2$ and can be thermally grown on the surface of the wafer. The purpose of this layer is to cushion the transition of the stress between the silicon substrate and the subsequently deposited layer 16 of nitride. In general, the thicker the layer 14 of pad oxide, the less edge force is being transmitted from the nitride 16 to the silicon substrate 10. On the other hand, a thick layer of pad-oxide will render the nitride layer 16 ineffective as an oxidation mask by allowing lateral oxidation to take place. Therefore, the minimum pad-oxide that will avoid the formation of dislocations should be used. Typically, a blanket pad oxide can be formed to a thickness of about 150 Angstrom through a thermal oxidation method at a temperature of about 900 degrees C. for a time period of about 10 to 20 minutes. The process of the invention lends itself to the deposition of layer 14 of sacrificial oxide that is considerably thinner that the indicated 150 Angstrom, that is to a layer 14 with a thickness between 100 and 200 Angstrom.

The layer 16 of silicon nitride ($Si_3N_4$) can be deposited using LPCVD or PECVD procedures at a pressure between about 300 mTorr and 400 mTorr, at a temperature between about 600 and 800 degrees C., to a thickness of about 2500 Angstrom using $NH_3$ and $SiH_4$. The silicon nitride layer 16 can also be deposited using LPCVD or PECVD procedures using a reactant gas mixture such as dichlorosilane ($SiCl_2H_2$) and amonia ($NH_3$).

A conventional channel implant (not shown in FIG. 1) has also been performed into the surface of the substrate 10 that is shown in cross section in FIG. 1. Conditions for channel implants vary widely and are determined by the particular application for which a device is being created. As examples, a channel implant can be a P-well implant using boron with an energy within the range of between 100 to 220 keV and a dose within the range of between 1e13 to 1e14 atoms/cm$^2$, it can be a P-well implant using boron with an energy within the range of between 5 to 40 keV and a dose within the range of between 1e12 to 5e13 atoms/cm$^2$, it can be a P-well implant using indium with an energy within the range of between 50 to 250 keV and a dose within the range of between 1e12 to 1e14 atoms/cm$^2$, it can be an N-well implant using phosphorus with an energy within the range of between 300 to 600 keV and a dose within the range of between 1e13 to 5e14 atoms/cm$^2$, it can be an N-well implant using phosphorus with an energy within the range of between 50 to 300 keV and a dose within the range of between 1e12 to 5e13 atoms/cm$^2$, etc.

FIG. 3 shows a cross section after the layer 16 of nitride has been patterned using the reverse gate pattern for the gate where a thin layer of oxide must be created. Layer 18 is a layer of photoresist and is patterned as shown such that the opening 20 that is created in the layer 18 of photoresist aligns with the region of the sacrificial layer 14 of oxide where the thin layer of oxide is to be created.

The deposition and patterning of the layer 18 of photoresist uses conventional methods of deposition and photolithography that are well known in the art. Photoresist stripping frequently uses sulfuric acid ($H_2SO_4$) and mixtures of $H_2SO_4$ with other oxidizing agents such as hydrogen peroxide ($H_2O_2$), the same components are frequently used in cleaning a wafer surface after the photoresist has been stripped.

FIG. 4 shows a cross section after the layer 16 of nitride has been etched in accordance with the mask that is provided by the patterned layer 18 of photoresist.

The silicon nitride layer 16 can be wet etched using a phosphoric acid solution. The silicon nitride can also be etched using anisotropic RIE using $CHF_3$ or $SF_6$—$O_2$ as an etchant. The silicon nitride layer 14 can also be dipped into phosphoric acid ($H_3PO_4$) to be removed.

The preferred method of the invention to etch the nitride layer 16 removes the layer 16 of nitride down to and into the surface of the underlying layer 14 of sacrificial oxide, the etch is an anisotropic nitride etch. In the cross section that is shown in FIG. 4, the layer 14 of sacrificial oxide is relatively thick when compared with the thickness of the gate oxide. This relative thickness allows for sufficient margin of over-etch into the surface of the layer 14 of sacrificial oxide. The possibility of etching through the layer 14 of sacrificial oxide and etching into the surface of substrate 10 is therefore eliminated. By not etching into the surface of the substrate 10, defects are prevented.

Figure 5:
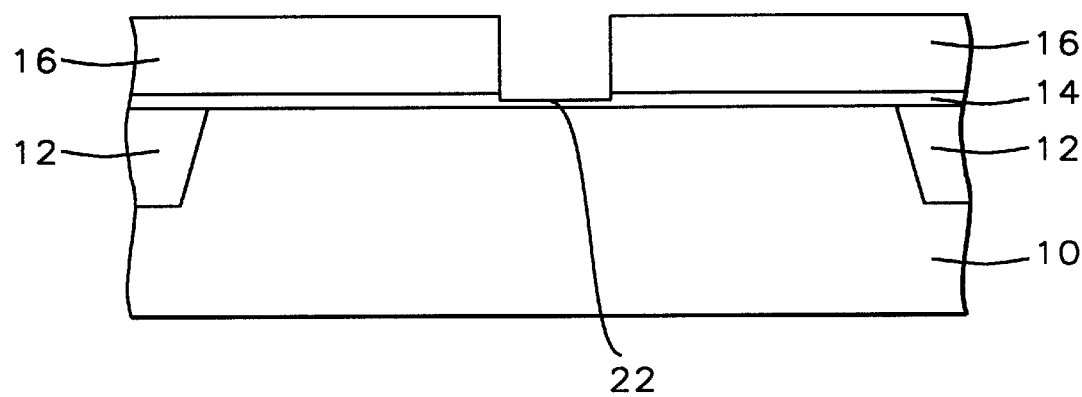

FIG. 5 shows a cross section where the photoresist mask 18 has been removed and the thin layer 22 of gate oxide has been created. The layer 18 of photoresist is removed using the conventional process of ashing followed by clean. The remaining layer 14 is to be completely removed before layer 22 is grown. The thin layer 22 of gate oxide is created at the bottom of opening 20 by rapid thermal oxidation at a temperature between about 800 and 1000 degrees C. for a time between about 10 and 20 seconds thereby forming a thin layer of gate oxide with a thickness between about 10 and 30 Angstrom. The presence of the layer 14 of sacrificial oxide serves not only to act as an etch stop for the nitride layer 16 but also to cushion the stress in the silicon substrate 10 during gate oxidation. This is important in order to assure consistent oxide uniformity and oxide quality at the edge of the polysilicon gate electrode.

Figure 6:
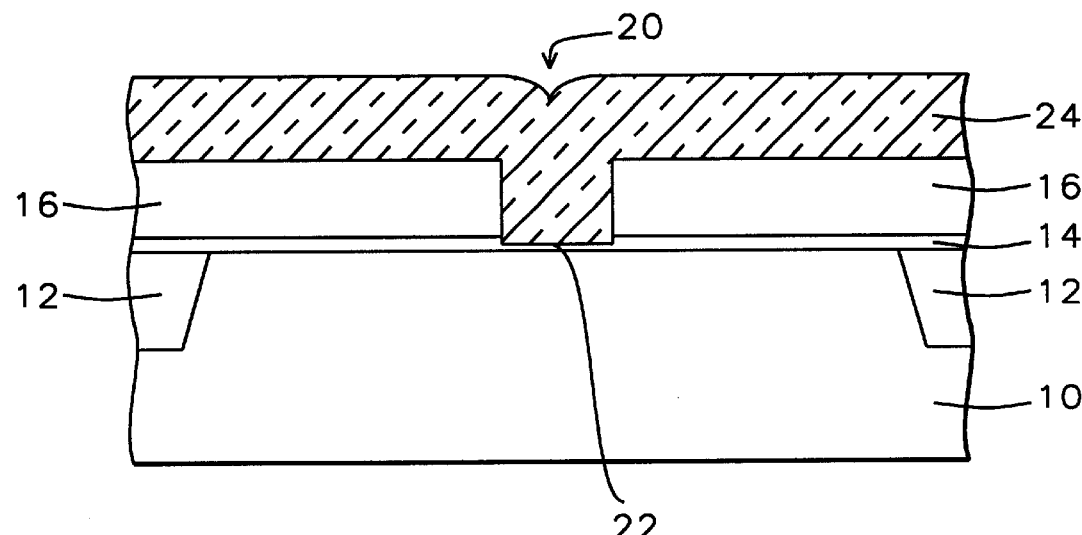

FIG. 6 shows a cross section after a layer 24 of polysilicon has been blanket deposited over the layer 16 of nitride including the opening 20 that has previously been etched in the layer of nitride. Layer 24 of polysilicon can be deposited at a temperature between 600 and 640 degrees C. using LPCVD to a thickness of between about 3000 and 4000 Angstrom. The thickness of poly layer 24 must exceed the thickness of layer 16 of nitride and must preferably be between about 1.5 and 2 times as thick as the thickness of layer 16.

Figure 7:
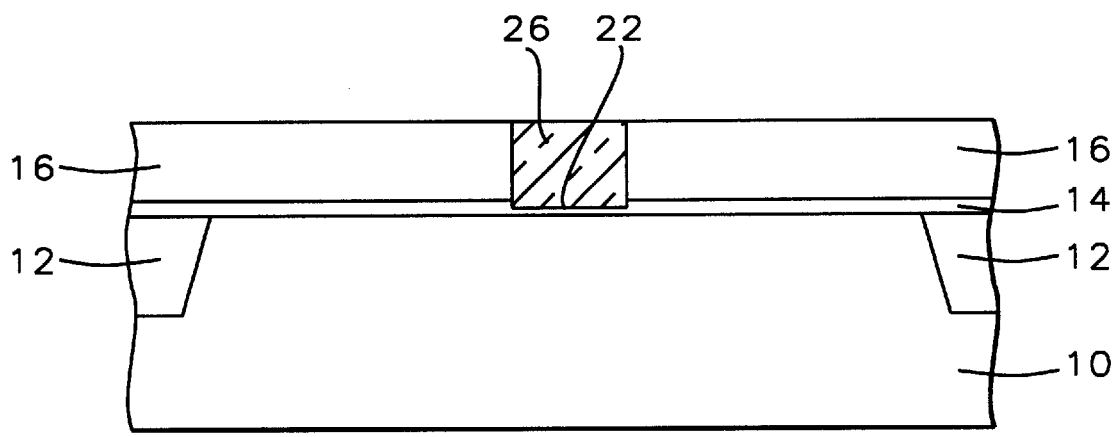

FIG. 7 shows a cross section after the layer 24 of poly has been polished thereby leaving a gate electrode 26 of poly in place over the thin layer 22 of gate oxide. The layer 24 of poly is removed using CMP and is removed to the surface of the layer 16 of nitride. The layer 24 of poly can also be removed by etching using a reverse mask.

Figure 8:
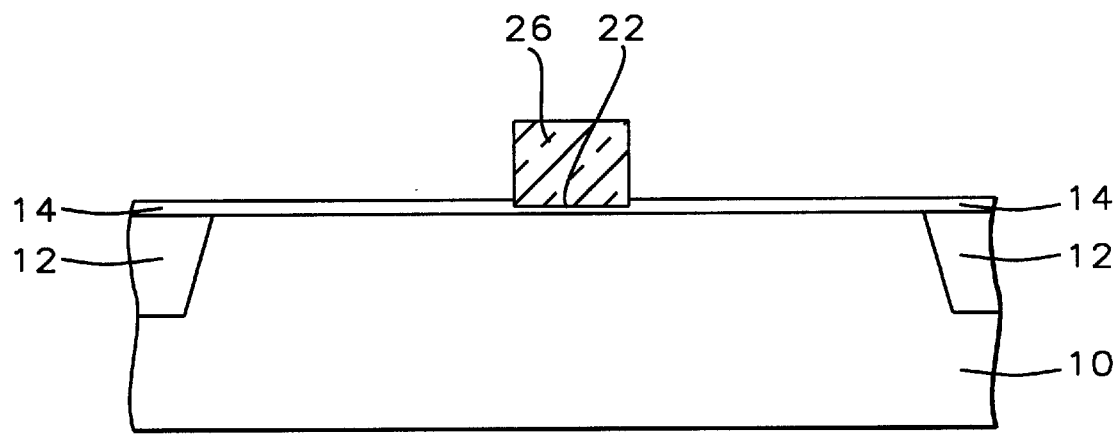

FIG. 8 shows the final processing step of the first embodiment of the invention where the nitride layer 16 is removed from the surface of the substrate 10 and from layer 14 of sacrificial oxide. The layer of nitride has been selectively removed through an isotropic acid wet etch leaving the gate oxide unaffected by any plasma etch. This leaves gate electrodes 26 in place, underlying this gate electrode 26 is the layers 22 of very thin gate oxide thickness. The gate electrode structure that has been created up to this point is now ready for further processing.

FIGS. 9 through 17 address the second embodiment of the invention.

Figure 9:
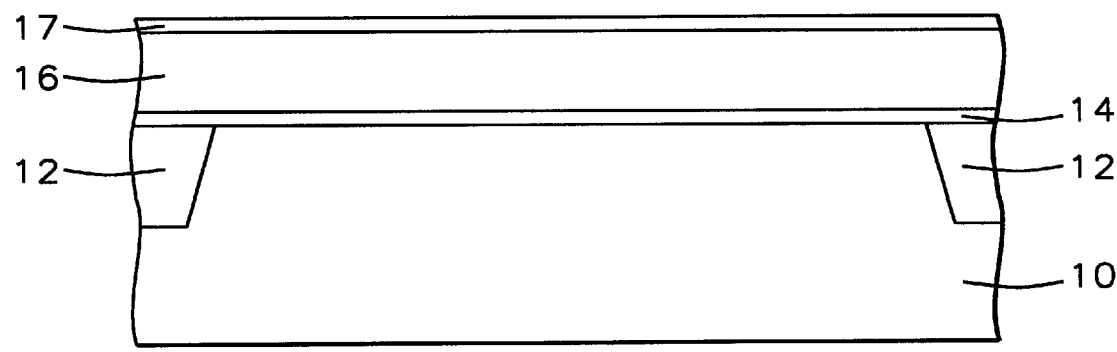
FIGS. 9 through 17 address the second embodiment of the invention, as follows.

FIG. 9 shows a cross section of a semiconductor surface 10 in which Shallow Trench Isolation regions 12 have been formed, a thin layer 14 of sacrificial oxide has been grown, a layer 16 of nitride has been deposited over the layer 14 of gate oxide, a layer 17 of TEOS oxide has been deposited over the layer 16 of nitride. The layer 14 of sacrificial oxide has been grown to a thickness of about 200 Angstrom, nitride layer 16 is of a thickness of about 2500 Angstrom, layer 17 of TEOS is of a thickness of about 250 Angstrom.

Where the processing steps and processing conditions of the second embodiment of the invention are identical to the processing conditions of the first embodiment of the invention, these conditions will not be restated under this explanation of the second embodiment of the invention.

The layer 17 of tetra-ethyl-ortho-silicate (TEOS) has been deposited to a thickness of about 250 Angstrom using LPCVD procedures at a temperature of between about 600 and 700 degrees C.

Figure 10:
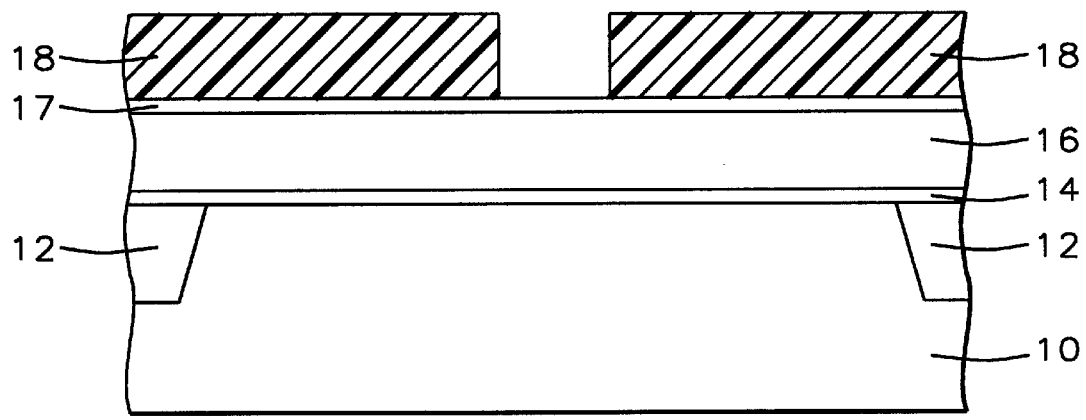

FIG. 10 shows a cross section after a layer 18 of photoresist has been deposited over the layer 17 of TEOS oxide and has been reverse patterned for the gate electrode. The processing conditions for this step of the invention have previously been detailed under FIG. 3 of the first embodiment of the invention.

Figure 11:
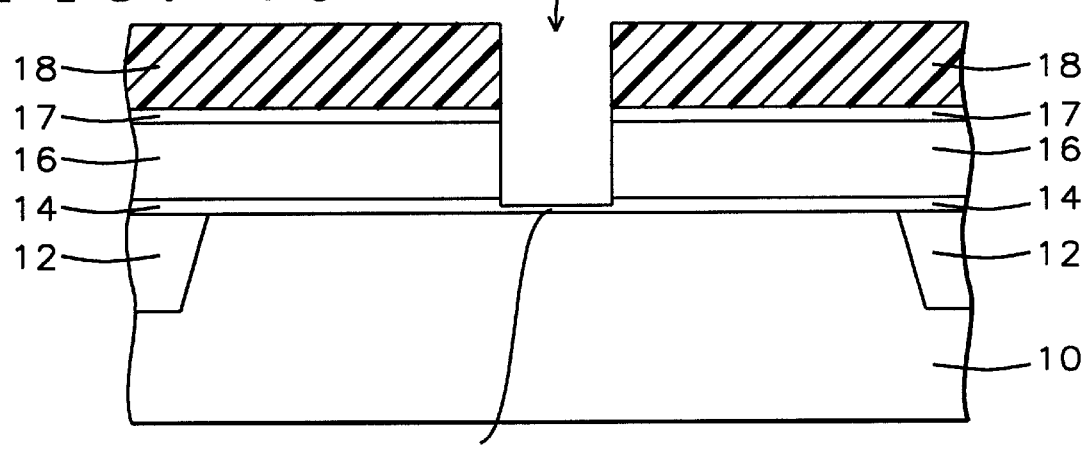

FIG. 11 shows a cross section after the layer 17 of TEOS oxide and the layer 16 of nitride have been etched in accordance with the pattern of the layer of photoresist. The preferred etching conditions for the TEOS etch are as follows: etchant gas: $CF_4$ or $CHF_3$ at a flow rate of about 15 sccm, gas pressure about 800 mTorr, rf power density about 400 Watts, no magnetic field applied, wafer temperature about −17 degrees C., time of the etch about 10 seconds. The etching processing conditions for the layer 16 of nitride have already been highlighted previously under FIG. 4 of the first embodiment of the invention.

It must be noted in FIG. 11 that the layer 14 of sacrificial oxide has been significantly reduced in thickness at the bottom of the opening 20. The thickness of the sacrificial oxide in region 22 has been reduced from about 200 Angstrom to about 150 Angstrom. The processing conditions that are applied for this reduction in thickness have previously been indicated. In the cross section that is shown in FIG. 11, the layer 14 of sacrificial oxide is relatively thick when compared with the thickness of the gate oxide. This relative thickness allows for sufficient margin of over-etch into the surface of the layer 14 of sacrificial oxide. The possibility of etching through the layer 14 of sacrificial oxide and etching into the surface of substrate 10 is therefore eliminated. It must again be emphasized that the etch must not etch into the surface of the underlying substrate, this can be assured by some of the layer 14 of sacrificial oxide remaining in place.

Figure 12:
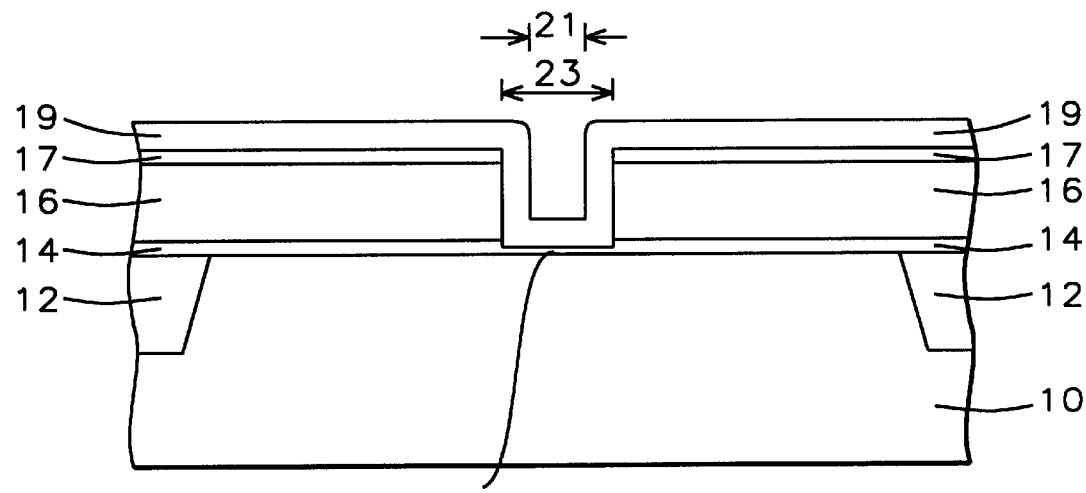

FIG. 12 shows a cross section after the layer 18 of patterned photoresist has been removed from the surface of the layer 17 of TEOS oxide and a thin layer 19 of nitride has been deposited over the layer 17 of TEOS oxide thereby including the opening 20 that has been created in the layer of nitride.

The processing conditions for the removal of the photoresist have previously been indicated.

Silicon nitride is frequently used to form and isolation film or passivation layer and contains monosilane ($SiH_4$) and amonia ($NH_3$). Typical gate spacer materials are silicon nitride, silicon oxide, BSG, PSG, polysilicon, other materials preferably of a dielectric nature, CVD oxide formed from a TEOS source or amorphous materials that inhibit the deposition of epitaxial silicon thereupon. Layer 19 will at a later step in the process of the second embodiment of the invention be etched to form the gate spacers of the gate electrode. Layer 19 of silicon nitride can be deposited employing silane (such as dichlorosilane ($SiCl_2H_2$)) as a silicon source material and ammonia (such as ($NH_3$)) as a nitrogen source material using LPCVD or PECVD procedures, at a temperature between about 600 and 800 degrees C., at a pressure between about 300 mTorr and 400 mTorr, to a thickness between about 200 and 300 Angstrom.

The deposition of the layer 19 of nitride, FIG. 12, reduces the gate dimensions while maintaining the larger damascene space for easier masking control. Typical dimensions for the opening 20 for the gate electrode are dimension 21 which equals about 0.13 um and dimension 23 which equals about 0.18 um. The dimension 21 should typically be about the dimension 20 minus two times the thickness of layer 19 of nitride.

Figure 13:
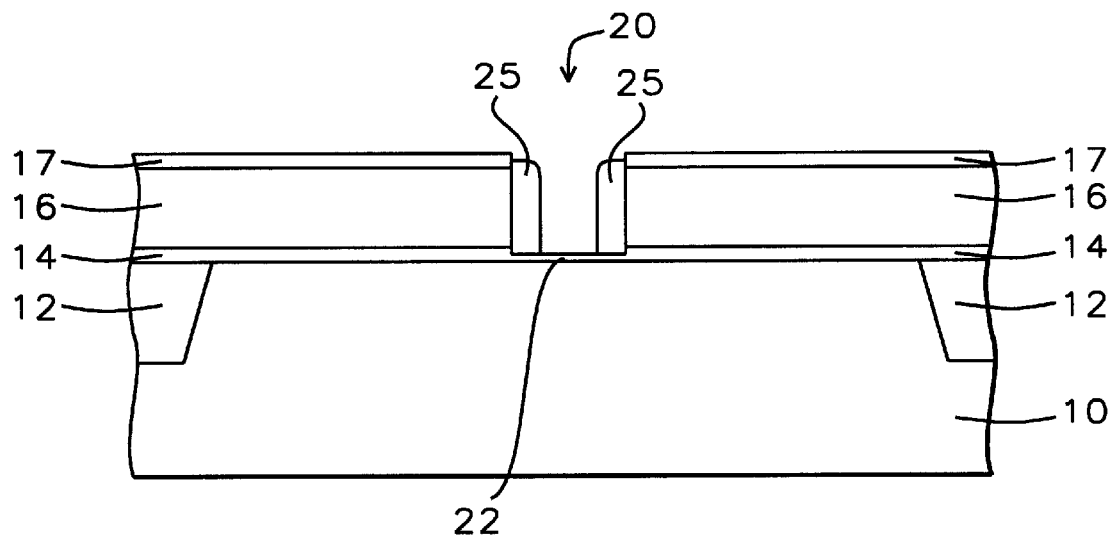

FIG. 13 shows a cross section after the thin layer 19 of nitride has been etched thereby creating the sidewall spacers 25 for the gate electrode. The etch of layer 19 of thin silicon nitride is selective to oxide and can be performed via isotropic etch of said silicon nitride layer 19, using CHF$_3$ or SF$_6$—O$_2$ as an etchant. Silicon nitride layer 19 can also be dipped into phosphoric acid (H$_3$PO$_4$) to be removed. This dip must occur for a fixed time, such that layer 25 of nitride spacer remains in place. The etch of the thin layer 19 of silicon nitride leaves in place the nitride where it had been most densely deposited, that is on the sidewalls of the opening 20. This silicon nitride 25 that is left in place forms that gate spacers for the gate electrode.

Figure 14:
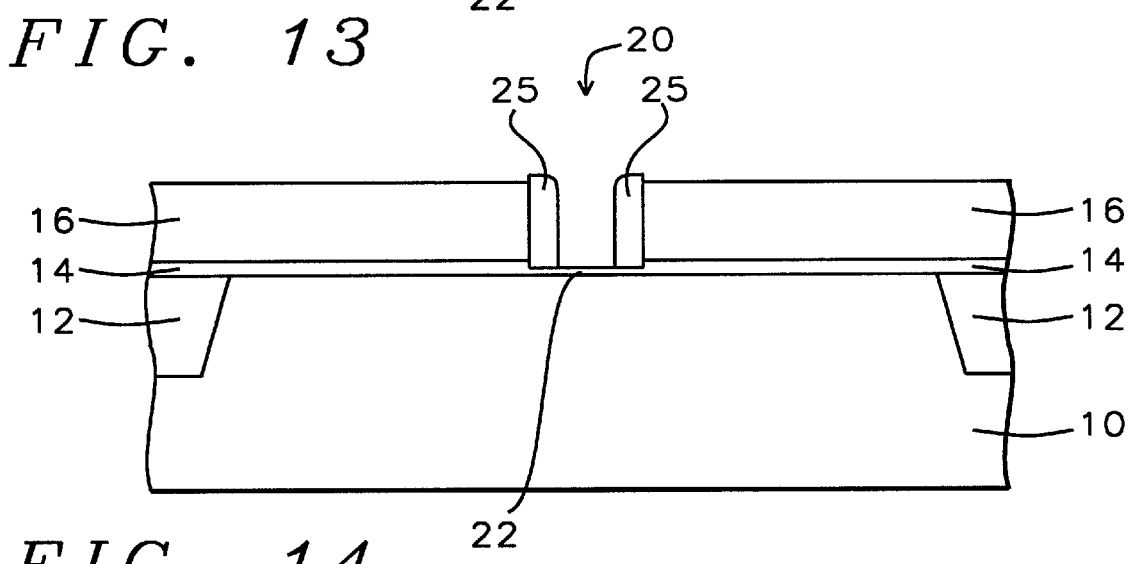

FIG. 14 shows a cross section after the layer of sacrificial oxide has been transformed into a layer of gate oxide 22 and the thin layer 17 of TEOS oxide has been removed. The processing conditions for these processing steps have previously been indicated. The presence of the sacrificial oxide acts not only as an etch stop for the nitride etch but also acts to cushion the stress in the silicon substrate during gate oxidation. This is important in assuring consistent oxide uniformity and oxide quality at the edge of the poly gate. During the process of pre-gate clean, the oxides at the gate area and on top of the nitride layer are removed. There now remains an ultra-thin layer 22 of gate dielectric at the bottom of opening 20 for the gate electrode.

Figure 15:
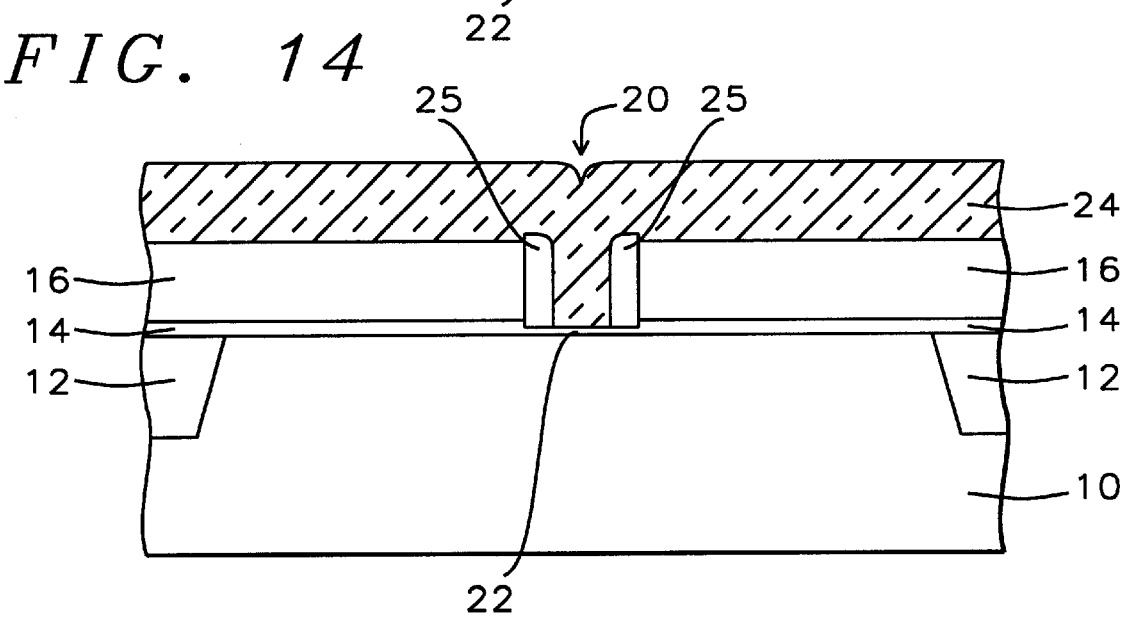
Figure 16:
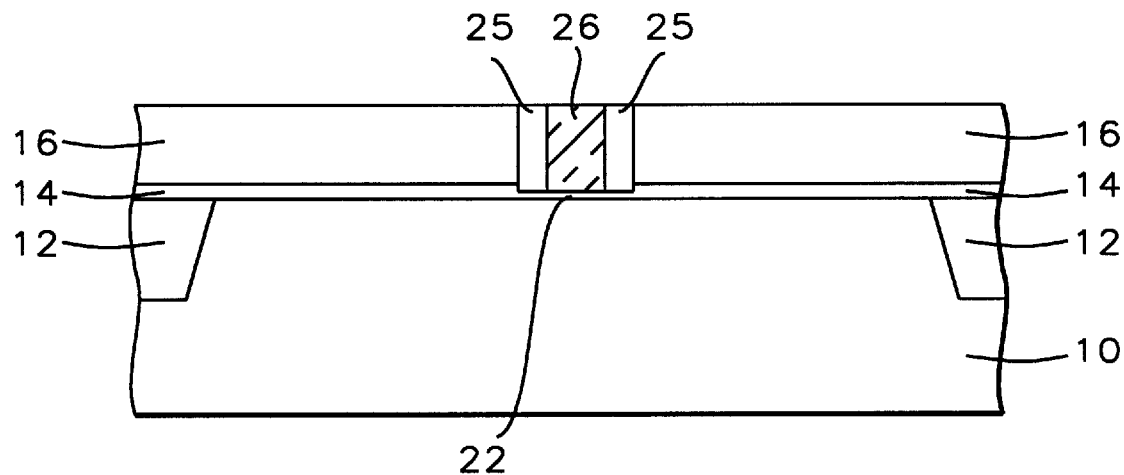
Figure 17:
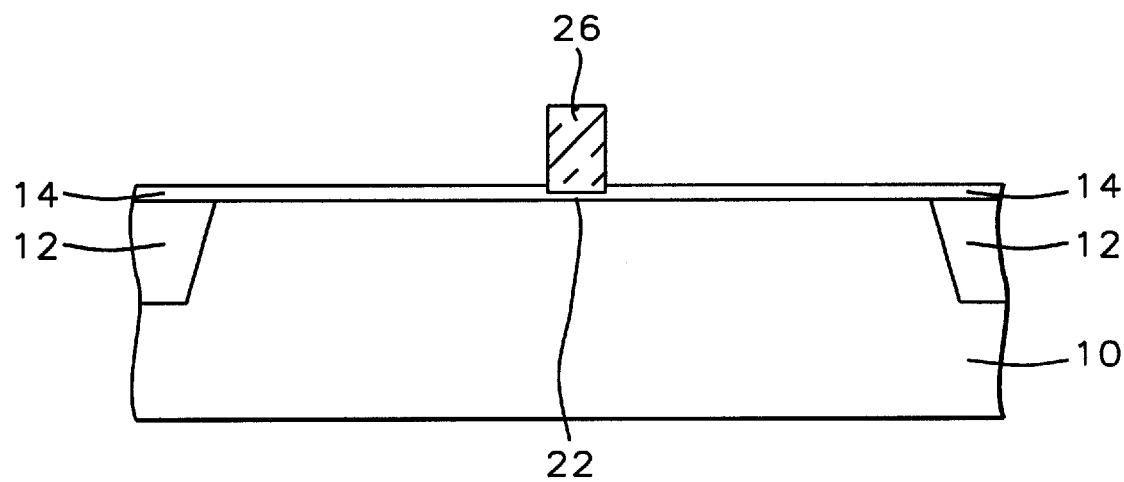

FIG. 15 shows a cross section after a thick layer 24 of poly has been deposited over the surface of the layer 16 of nitride thereby including the opening 20 that has been created in the layer of nitride. FIG. 16 shows a cross section wherein the thick layer 24 of poly has been selectively polished down to the surface of the nitride layer 16 leaving a plug 26 of poly inside opening 20 to form the poly gate electrode. The removal of layer 24 of poly can be accomplished by either CMP or by a selective etch using a reverse mask for the etch. FIG. 17 shows a cross section of the poly gate after the nitride has been removed using an isotropic phosphoric wet etch thereby leaving the gate poly 26 in place. It must be noted that, during the processing steps of the second embodiment of the invention, the gate oxide layer was not affected by any plasma etch that is part of the processing of the second embodiment of the invention. The structure that has been created up to this point is now ready for further processing.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating ultra-thin layers of gate oxide whereby said ultra-thin layers of gate oxide serve as gate oxide of a polysilicon gate structure, comprising the steps of:

providing a semiconductor substrate wherein said semiconductor substrate comprises an active region that is laterally displaced between a pair of isolation regions;

growing a layer of sacrificial gate oxide on a surface of said substrate;

performing channel implant into a surface of said substrate;

depositing a layer of nitride over a surface of said layer of sacrificial gate oxide;

patterning and etching said layer of nitride thereby creating openings in said layer of nitride thereby furthermore exposing surface areas of said layer of gate oxide where said ultra-thin layers of gate oxide are to be created, allowing for an over-etch into the surface of the layer of sacrificial oxide, thereby partially retaining the layer of sacrificial oxide over a bottom surface of said openings;

pre-cleaning said exposed surface of said layer of sacrificial gate oxide where said ultra-thin layers of gate oxide are to be created thereby creating pre-cleaned areas where said ultra-thin layers of gate oxide are to be created;

performing gate oxide growth over said pre-cleaned areas thereby creating said ultra-thin layers of gate oxide;

depositing a layer of polysilicon over a surface of said layer of nitride thereby including said openings in said layer of nitride said layer of polysilicon thereby overlaying said ultra-thin layers of gate oxide;

removing said layer of polysilicon from a surface of said layer of nitride thereby leaving said deposited polysilicon inside said openings in said layer of nitride thereby creating poly gate structures that overly said ultra-thin layers of gate oxide; and removing said layer of nitride thereby leaving said poly gate structures in place.

2. The method of claim 1 wherein said growing a layer of sacrificial gate oxide on a surface of said substrate is forming a blanket layer of pad oxide formed to a thickness of between about 100 and 200 Angstrom through a thermal oxidation method at a temperature of about 900 degrees C. for a time period of about 10 to 20 minutes.

3. The method of claim 1 wherein said depositing a layer of nitride over a surface of said layer of gate oxide is depositing a of silicon nitride (Si$_3$N$_4$) using LPCVD or PECVD procedures at a pressure between about 300 mTorr and 400 mTorr, at a temperature between about 600 and 800 degrees C., to a thickness between about 2000 and 3000 Angstrom using NH$_3$ and SiH$_4$.

4. The method of claim 1 wherein said depositing a layer of nitride over a surface of said layer of gate oxide is depositing a of silicon nitride (Si$_3$N$_4$) using LPCVD or PECVD procedures at a pressure between about 300 mTorr and 400 mTorr, at a temperature between about 600 and 800 degrees C., to a thickness between about 2000 and 3000 Angstrom using a reactant gas mixture such as dichlorosilane (SiCl$_2$H$_2$) and ammonia (NH$_3$).

5. The method of claim 1 wherein said etching said layer of nitride is an anisotropic nitride etch that is selective to an underlying layer of sacrificial gate oxide, allowing for an over-etch into the surface of the layer of sacrificial oxide, thereby preventing over-etching or gauging of said substrate.

6. The method of claim 1 wherein said performing gate oxide growth over said pre-cleaned areas thereby creating said ultra-thin layers of gate oxide is performing a rapid thermal oxidation at a temperature between about 800 and 1000 degrees C. for a time between about 10 and 20 seconds thereby forming said ultra-thin layer of gate oxide with a thickness between about 10 and 30 Angstrom.

7. The method of claim 1 whereby said depositing a layer of polysilicon over a surface of said layer of nitride includes depositing said layer of polysilicon to a thickness of between about 3000 and 4000 Angstrom over a surface of said ultra-thin layers of gate oxide.

8. The method of claim 1 wherein said removing said layer of polysilicon from a surface of said layer of nitride is a selective polishing procedure that uses polysilicon CMP techniques with or without the aid of reverse mask whereby end-point for said polysilicon removal is reached when the thickness of said layer of nitride has been reduced from between about 2000 and 3000 Angstrom to between about 1500 and 2500 Angstrom.

9. The method of claim 1 wherein said removing said layer of nitride is an isotropic phosphoric acid wet etch thereby leaving said ultra-thin layer of gate oxide unaffected by plasma etch.

10. A method of creating ultra-thin layers of gate oxide underlying polysilicon gate structures, comprising the steps of:

providing a semiconductor substrate said substrate having been provided with Shallow Trench Isolation regions in its surface whereby a layer of sacrificial gate oxide has been deposited on a surface of said substrate including a surface of said STI regions to a thickness between about 100 and 200 Angstrom whereby furthermore a channel implant has been performed into a surface of said substrate;

depositing a layer of nitride over a surface of said layer of sacrificial gate oxide to a thickness between about 2000 and 3000 Angstrom;

patterning and etching said layer of nitride whereby said patterning and etching creates openings in said layer of nitride that align with surface areas in said layer of sacrificial gate oxide where said ultra-thin layers of gate oxide are to be created thereby exposing said layer of said sacrificial gate oxide in said surface areas said etching of nitride being an anisotropic etch that is selective to the underlying layer of sacrificial oxide, allowing for an over-etch into the surface of the layer of sacrificial oxide;

pre-cleaning said exposed surface of said layer of sacrificial gate oxide where said ultra-thin layers of gate oxide are to be created thereby creating pre-cleaned areas where said ultra-thin layers of gate oxide are to be created;

performing gate oxide growth over said pre-cleaned areas thereby creating said ultra-thin layers of gate oxide;

depositing a layer of polysilicon over a surface of said layer of nitride to a thickness between about 3000 and 4000 Angstrom thereby including a surface area of said ultra-thin layers of gate oxide;

removing said layer of polysilicon from a surface of said layer of nitride thereby leaving said poly inside said openings in said layer of nitride said removal to apply methods of polysilicon CMP either with or without aid of reverse mask said removal of said layer of polysilicon to proceed to a point where the thickness of said layer of nitride has been reduced from between about 2000 and 3000 Angstrom to between about 1500 and 2500 Angstrom thereby forming a polysilicon gate structure that overlies said ultra-thin layers of gate oxide; and removing said layer of nitride from a surface of said layer of sacrificial gate oxide using an isotropic phosphoric wet etch thereby leaving said polysilicon gate structure in place.

11. A method of creating ultra-thin layers of gate oxide whereby said ultra-thin layers of gate oxide serve as a gate oxide of a polysilicon gate structure, comprising the steps of:

providing a semiconductor substrate wherein said semiconductor substrate comprises an active region that is laterally displaced between a pair of isolation regions;

growing a layer of sacrificial gate oxide on a surface of said substrate to a thickness of between about 150 and 250 Angstrom;

performing channel implant into a surface of said substrate;

depositing a layer of nitride over a surface of said layer of gate oxide to a thickness of between about 2000 and 3000 Angstrom;

depositing a layer of tetra-ethyl-ortho-silicate (TEOS) oxide on a surface of said layer of nitride to a thickness of between about 200 and 300 Angstrom;

patterning and etching said layer of TEOS oxide and said layer of nitride thereby creating openings in said layer of TEOS oxide and said layer of nitride thereby furthermore exposing a surface areas of said layer of sacrificial gate oxide where said ultra-thin layers of gate oxide are to be created, allowing for an over-etch into the surface of the layer of sacrificial oxide;

depositing a thin conformal layer of nitride over a surface of said layer of TEOS oxide to a thickness between about 200 and 300 Angstrom thereby including said created openings in said layer of TEOS oxide and said layer of nitride;

isotropically etching said thin conformal layer of nitride thereby removing said conformal layer of nitride from a surface of said layer of TEOS oxide thereby furthermore forming thin sidewall spacers on sidewalls of said openings in said layer of TEOS oxide and said layer of nitride said etch to be selective to oxide thereby furthermore exposing a surface of said layer of sacrificial gate oxide where said ultra-thin layers of gate oxide are to be created;

pre-cleaning said exposed surface of said layer of sacrificial gate oxide where said ultra-thin layers of gate oxide are to be created thereby creating pre-cleaned areas where said ultra-thin layers of gate oxide are to be created said pre-cleaning to remove said TEOS oxide from the surface of said layer of nitride said pre-cleaning furthermore removing said sacrificial oxide from surface areas where said ultra-thin layers of gate oxide are to be created;

performing gate oxide growth over said pre-cleaned areas thereby creating said ultra-thin layers of gate oxide;

depositing a layer of polysilicon over a surface of said layer of nitride thereby including said openings in said layer of nitride said layer of polysilicon thereby overlaying said ultra-thin layers of gate oxide;

removing said layer of polysilicon from a surface of said layer of nitride thereby leaving said deposited polysilicon inside said openings in said layer of nitride thereby creating poly gate structures that overly said ultra-thin layers of gate oxide; and removing said layer of nitride thereby leaving said poly gate structures in place.

12. The method of claim 11 wherein said growing a layer of sacrificial gate oxide on a surface of said substrate is forming a blanket layer of pad oxide formed to a thickness of between about 150 and 250 Angstrom through a thermal oxidation method at a temperature of about 900 degrees C. for a time period of about 10 to 20 minutes.

13. The method of claim 11 wherein said depositing a layer of nitride over a surface of said layer of gate oxide is depositing a of silicon nitride ($Si_3N_4$) using LPCVD or PECVD procedures at a pressure between about 300 mTorr and 400 mTorr, at a temperature between about 600 and 800 degrees C., to a thickness between about 2000 and 3000 Angstrom using $NH_3$ and $SiH_4$.

14. The method of claim 11 wherein said depositing a layer of nitride over a surface of said layer of gate oxide is depositing a of silicon nitride (Si$_3$N$_4$) using LPCVD or PECVD procedures at a pressure between about 300 mTorr and 400 mTorr, at a temperature between about 600 and 800 degrees C., to a thickness between about 2000 and 3000 Angstrom using a reactant gas mixture such as dichlorosilane (SiCl$_2$H$_2$) and ammonia (NH$_3$).

15. The method of claim 11 wherein said depositing a layer of tetra-ethyl-ortho-silicate (TEOS) oxide on a surface of said layer of nitride uses PECVD procedures at a temperature of between about 350 and 450 degrees C. said layer of TEOS being deposited to a thickness of between about 200 and 300 Angstrom.

16. The method of claim 11 wherein etching said layer of TEOS oxide uses etchant gas of CF$_4$ or CHF$_3$ at a flow rate of about 15 sccm, gas pressure about 800 mTorr, rf power density about 400 Watts, no magnetic field applied, wafer temperature about −17 degrees C., time of the etch about 10 seconds.

17. The method of claim 11 wherein said etching said layer of nitride is an anisotropic nitride etch that is selective to the underlying layer of sacrificial gate oxide, allowing for an over-etch into the surface of the layer of sacrificial oxide.

18. The method of claim 11 wherein said depositing a thin conformal layer of nitride uses silane (such as dichlorosilane (SiCl$_2$H$_2$)) as a silicon source material and ammonia (such as (NH$_3$)) as a nitrogen source material using LPCVD or PECVD procedures deposited at a temperature between about 600 and 800 degrees C., at a pressure between about 300 mTorr and 400 mTorr, to a thickness between about 200 and 300 Angstrom.

19. The method of claim 11 wherein said isotropically etching said thin conformal layer of nitride uses CHF$_3$ or SF$_6$—O$_2$ as an etchant whereby said etch is selective to oxide said etch to from thin sidewall spacers on the sidewalls of said openings created in said layers of TEOS oxide and nitride.

20. The method of claim 11 wherein said performing gate oxide growth over said pre-cleaned areas thereby creating said ultra-thin layers of gate oxide is performing a rapid thermal oxidation at a temperature between about 800 and 1000 degrees C. for a time between about 10 and 20 seconds thereby forming said ultra-thin layer of gate oxide with a thickness between about 10 and 30 Angstrom.

21. The method of claim 11 whereby said depositing a layer of polysilicon over a surface of said layer of nitride includes depositing said layer of polysilicon to a thickness of between about 3000 and 4000 Angstrom over the surface of said ultra-thin layers of gate oxide.

22. The method of claim 11 wherein said removing said layer of polysilicon from a surface of said layer of nitride is a selective polishing procedure that uses polysilicon CMP techniques with or without aid of reverse mask whereby end-point for said polysilicon removal is reached when a surface of said layer of nitride is reached.

23. The method of claim 11 wherein said removing said layer of nitride is an isotropic phosphoric acid wet etch thereby leaving said ultra-thin layer of gate oxide unaffected by plasma etch.

24. A method of creating ultra-thin layers of gate oxide underlying polysilicon gate structures, comprising the steps of:

providing a semiconductor substrate said substrate having been provided with Shallow Trench Isolation regions in its surface whereby a layer of sacrificial gate oxide has been deposited on a surface of said substrate including a surface of said STI regions to a thickness between about 150 and 250 Angstrom whereby furthermore a channel implant has been performed into a surface of said substrate;

depositing a layer of nitride over a surface of said layer of sacrificial gate oxide to a thickness between about 2000 and 3000 Angstrom;

depositing a layer of TEOS oxide over a surface of said layer of nitride to a thickness of between about 200 and 300 Angstrom;

patterning and etching said layer of TEOS oxide and said layer of nitride whereby said patterning and etching creates openings in said layers of TEOS nitride and said layer of nitride that align with surface areas in said layer of sacrificial gate oxide where said ultra-thin layers of gate oxide are to be created thereby exposing said layer of said sacrificial gate oxide in said surface areas said etching of TEOS oxide being an anisotropic etch said etching of nitride being an anisotropic etch that is selective to the underlying layer of sacrificial oxide, allowing for an over-etch into the surface of the layer of sacrificial oxide;

depositing a thin conformal layer of nitride over a surface of said layer of TEOS to a thickness between about 200 and 300 Angstrom thereby including said openings that have been created in said layer of TEOS oxide and said layer of nitride;

isotropically etching said thin conformal layer of nitride thereby forming thin sidewall spacers on sidewalls of said openings in said layer of TEOS oxide and layer of nitride;

pre-cleaning said exposed surface of said layer of sacrificial gate oxide where said ultra-thin layers of gate oxide are to be created thereby creating pre-cleaned areas where said ultra-thin layers of gate oxide are to be created said pre-cleaning to remove said TEOS oxide from the surface of said layer of nitride and from the surface where said ultra-thin layers of gate oxide are to be created;

performing gate oxide growth over said pre-cleaned areas thereby creating said ultra-thin layers of gate oxide;

depositing a layer of polysilicon over a surface of said layer of nitride to a thickness between about 3000 and 4000 Angstrom thereby including the surface area of said ultra-thin layers of gate oxide;

removing said layer of polysilicon from a surface of said layer of nitride thereby leaving said poly inside said openings in said layer of nitride said removal to apply methods of polysilicon CMP either with or without aid of reverse mask said removal of said layer of polysilicon to proceed to a point where the thickness of said layer of nitride has been reduced from between about 2000 and 3000 Angstrom to between about 1500 and 2500 Angstrom thereby forming a polysilicon gate structure that overlies said ultra-thin layers of gate oxide; and removing said layer of nitride from a surface of said layer of sacrificial gate oxide using an isotropic phosphoric wet etch thereby leaving said polysilicon gate structure in place.

* * * * *